(12) United States Patent
Li

(10) Patent No.: US 11,659,649 B2
(45) Date of Patent: May 23, 2023

(54) ELECTRONIC DEVICE

(71) Applicant: BEIJING XIAOMI MOBILE SOFTWARE CO., LTD., Beijing (CN)

(72) Inventor: Yueliang Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 60 days.

(21) Appl. No.: 17/241,667

(22) Filed: Apr. 27, 2021

(65) Prior Publication Data
US 2022/0039251 A1 Feb. 3, 2022

(30) Foreign Application Priority Data

Jul. 30, 2020 (CN) .......................... 202010751661.3

(51) Int. Cl.
*H01R 13/658* (2011.01)
*H05K 1/02* (2006.01)
(Continued)

(52) U.S. Cl.
CPC ....... *H05K 1/0243* (2013.01); *H01R 13/6466* (2013.01); *H01R 13/6581* (2013.01);
(Continued)

(58) Field of Classification Search
CPC .............. H01R 12/724; H01R 13/6581; H01R 13/6582; H01R 13/6585; H01R 13/6658; H01R 13/6471; H01R 12/721; H01R 13/6466; H01R 13/6691; H01R 2201/16; H05K 1/0215; H05K 1/0218; H05K 2201/0715; H05K 5/0026; H05K 1/0243; H05K 1/111; H05K 2201/1006; H05K 2201/10098; H05K 1/0213; H05K 1/0216;
(Continued)

(56) References Cited

U.S. PATENT DOCUMENTS

| | | | | |
|---|---|---|---|---|
| 6,139,364 A | * | 10/2000 | Beutler | H04M 1/0274 439/607.01 |
| 9,544,405 B1 | * | 1/2017 | Kodama | H04B 3/56 |
| 2010/0164835 A1 | | 7/2010 | Tai et al. | |
| 2013/0257659 A1 | * | 10/2013 | Darnell | H05K 1/028 343/702 |
| 2015/0263458 A1 | * | 9/2015 | Guo | H01R 12/724 29/883 |

(Continued)

FOREIGN PATENT DOCUMENTS

| | | |
|---|---|---|
| JP | H0472982 B2 | 11/1992 |
| JP | 2018063889 A | 4/2018 |
| KR | 20190020971 A | 3/2019 |

OTHER PUBLICATIONS

Indian Patent Application No. 202144019301, Office Action dated Feb. 17, 2022, 5 pages.
Japanese Patent Application No. 2021-075787, Office Action dated Apr. 26, 2022, 4 pages.
Japanese Patent Application No. 2021-075787, English translation of Office Action dated Apr. 26, 2022, 4 pages.

(Continued)

*Primary Examiner* — Steven T Sawyer
(74) *Attorney, Agent, or Firm* — Cozen O'Connor

(57) ABSTRACT

An electronic device includes a housing, a circuit board, a charging interface and an antenna unit. The housing is provided with an external interface. The circuit board is arranged in the housing and includes a grounding metal. The charging interface is arranged in the housing and in communication with the external interface. The charging interface includes a metal casing. The metal casing is provided with a plurality of grounding solder pads, and the grounding solder pads are arranged to be separated from the grounding metal. The antenna unit is coupled with the charging interface.

18 Claims, 4 Drawing Sheets

(51) Int. Cl.
    *H05K 1/11*          (2006.01)
    *H01R 13/6581*    (2011.01)
    *H01R 13/6466*    (2011.01)
    *H01R 13/6585*    (2011.01)

(52) U.S. Cl.
    CPC ......... *H01R 13/6585* (2013.01); *H05K 1/111* (2013.01); *H05K 2201/1006* (2013.01); *H05K 2201/10098* (2013.01)

(58) Field of Classification Search
    CPC ............. H05K 1/0254; H05K 2201/07; H05K 9/0039; H05K 5/0017; H05K 5/04; H05K 9/0067; H04M 1/0277; H04M 1/0274; H04M 1/026; H02J 50/70; H02J 2310/22; H02J 50/005; H02J 7/0044; H02J 50/20; H01Q 1/44; H01Q 1/243; H01Q 1/38; H03H 7/0115
    See application file for complete search history.

(56) References Cited

U.S. PATENT DOCUMENTS

| | | | |
|---|---|---|---|
| 2016/0226132 A1* | 8/2016 | Kim | H01Q 5/378 |
| 2016/0276765 A1* | 9/2016 | Lee | H01R 13/04 |
| 2018/0103531 A1* | 4/2018 | Tokunaga | H01Q 1/50 |
| 2018/0122747 A1* | 5/2018 | Sun | H01L 25/16 |
| 2018/0287302 A1* | 10/2018 | Kim | H01R 13/6466 |
| 2020/0044312 A1* | 2/2020 | Wang | H01Q 1/243 |
| 2020/0225295 A1* | 7/2020 | Hyun | H01R 13/648 |

OTHER PUBLICATIONS

European Patent Application No. 21170871.4 extended Search and Opinion dated Nov. 8, 2021, 7 pages.
Korean Patent Application No. 10-2021-0049726, Office Action dated Dec. 27, 2022, 4 pages.
Korean Patent Application No. 10-2021-0049726, English translation of Office Action dated Dec. 27, 2022, 4 pages.

\* cited by examiner

ELECTRONIC DEVICE

CROSS-REFERENCE TO RELATED APPLICATION

This application claims priority to and benefits of Chinese Patent Application Serial No. 202010751661.3, filed on Jul. 30, 2020, the entire content of which is incorporated herein by reference.

TECHNICAL FIELD

The present disclosure relates to a technical field of electronic devices, and more particularly to an electronic device.

BACKGROUND

With the development of full screens, also referred to as edge-to-edge or bezel-less displays, a clearance area of a bottom of an electronic device such as a mobile phone is gradually reduced, which leads to a reduction in radiation efficiency of an antenna unit. Therefore, it is necessary to increase the clearance area of the antenna unit without affecting the full screen. At present, a metal casing of a charging interface is connected with a grounding metal of a circuit board, which affects the clearance area of the antenna unit arranged close to the charging interface and is not conducive to improving the antenna performance of the antenna unit.

SUMMARY

The present disclosure provides an improved electronic device.

A first aspect of the present disclosure provides an electronic device, and the electronic device includes: a housing provided with an external interface; a circuit board arranged in the housing and including a grounding metal; a charging interface arranged in the housing and in communication with the external interface, the charging interface including: a metal casing, the metal casing being provided with a plurality of grounding solder pads, the grounding solder pads being arranged to be separated from the grounding metal; and an antenna unit being coupled with the charging interface.

DETAILED DESCRIPTION

Figure 1:
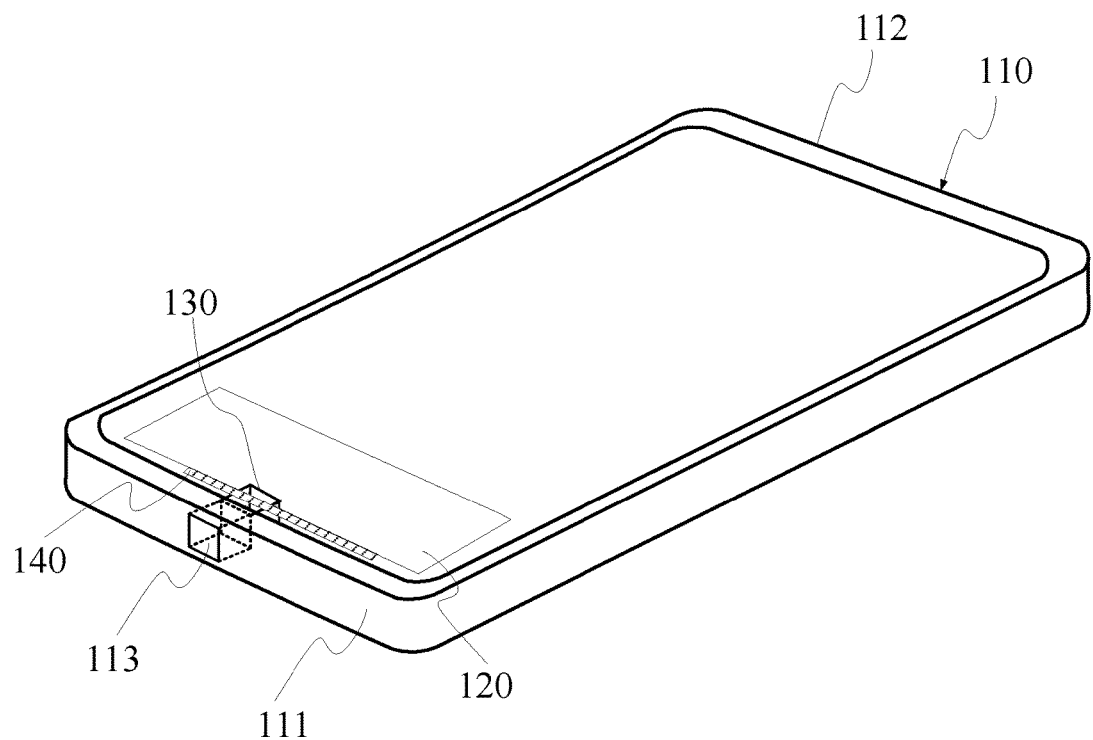
FIG. 1 illustrates a schematic view of a three-dimensional structure of an electronic device according to an exemplary embodiment of the present disclosure.

Exemplary embodiments of the present disclosure will be described in details herein, and the examples thereof are illustrated in the accompanying drawings. When the description below concerns the drawings, same numbers in different drawings represent same or similar elements unless indicated otherwise. In the following exemplary embodiments, the embodiments illustrated do not represent all embodiments consistent with the present disclosure. Instead, they are merely examples of devices and methods consistent with some aspects of the present disclosure as detailed in the appended claims.

The terms used in the present disclosure are merely for the purpose of describing specific embodiments, which are not intended to limit the present disclosure. Unless defined otherwise, the technical or scientific terminologies used in the present disclosure shall be the general meaning understood by those skilled in the related art of the present disclosure. Terms such as "first", "second" and the like used in the descriptions and claims of the present disclosure do not indicate any order, quantity or importance, but are only used to distinguish different components. Similarly, terms such as "one" or "a" do not refer to quantity limitation, but to indicate the existence of at least one. Unless specified otherwise, terms such as "comprise" or "comprising" and the like mean that the elements or objects presented before "comprise" or "comprising" contain the elements or objects presented after "comprise" or "comprising" and their equivalents, which do not exclude other elements or objects. The terms "mounted," "connected," and the like are not restricted to physical or mechanical connections, may also be electrical connections, no matter direct or indirect.

As used in the descriptions and the appended claims of the present disclosure, "a", "said" and "the" in singular forms mean including plural forms, unless clearly indicated in the context otherwise. It should also be understood that, the term "and/or" used herein represents and contains any and all possible combinations of one or more associated listed items.

In some embodiments, the electronic device includes a middle frame, a charging interface, a circuit board, and an antenna unit. The charging interface includes a metal casing, a plurality of pins and a plastic body carrying the plurality of pins. The metal casing is fitted over the plastic body and the plurality of pins, and the plastic body separates the metal casing and the plurality of pins. The metal casing is provided with a plurality of grounding solder pads connected with a grounding metal of the circuit board, and the plurality of pins are electrically connected with the circuit board. The middle frame is provided with an external interface in communication with the charging interface. The antenna unit may be arranged on the middle frame and close to the charging interface. Since the grounding solder pad of the metal casing is connected with the grounding metal of the circuit board, which is equivalent to the metal casing being the grounding metal, such that an area where the charging interface is located is not the clearance area, resulting in a relatively small clearance area of the antenna unit, which is not conducive to the radiation efficiency of the antenna unit.

In order to solve the above problems, the embodiments of the present disclosure provide an electronic device, which is described in detail below in combination with the drawings:

In the embodiment of the present disclosure, the electronic device includes, but is not limited to, a mobile phone, a tablet computer, an iPad, a digital broadcasting terminal, a message receiving and sending device, a game console, a medical facility, a fitness facility, a personal digital assistant, an intelligent wearable device, an intelligent television, a sweeping robot, and a smart speaker, etc.

Figure 2:
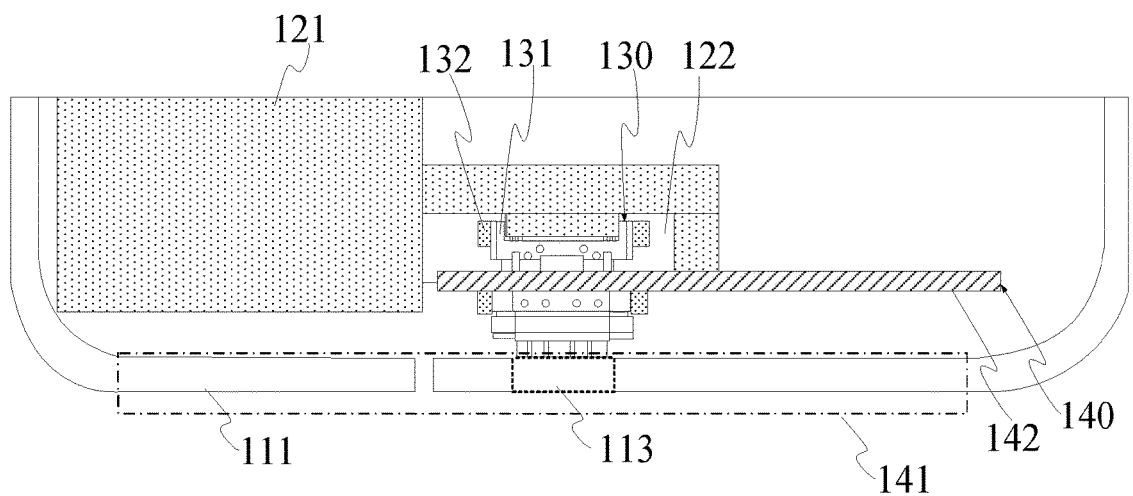
FIG. 2 illustrates a partial schematic view of an electronic device according to an exemplary embodiment of the present disclosure.

FIG. 1 illustrates a schematic view of a three-dimensional structure of an electronic device according to an exemplary embodiment of the present disclosure. FIG. 2 illustrates a partial schematic view of an electronic device according to an exemplary embodiment of the present disclosure. Referring to FIGS. 1 and 2, the electronic device includes a housing 110, a circuit board 120, a charging interface 130, and an antenna unit 140.

The housing 110 is provided with an external interface 113. Exemplarily, the housing 110 includes a first frame 111 and a second frame 112 opposite to the first frame 111, and the external interface 113 is arranged on the first frame 111. The first frame 111 and the second frame 112 are two opposite parts of the frame of the housing 110, the structures of which are not specifically limited. Exemplarily, the housing 110 presents a rectangular structure, a square structure, or other regular and irregular structures. Exemplarily, the housing 110 includes the middle frame including the first frame 111 and the second frame 112 opposite to the first frame 111.

The circuit board 120 is arranged in the housing 110 and includes a grounding metal 121. The circuit board 120 may be connected with various function modules in the electronic device to supply power for the function modules. Exemplarily, the circuit board 120 includes a radio frequency circuit board connected with the antenna unit 140 to control operation of the antenna unit 140.

The charging interface 130 is arranged in the housing 110 and in communication with the external interface 113. The charging interface 130 includes: a metal casing 131, the metal casing 131 includes a plurality of grounding solder pads 132, and the grounding solder pads 132 are arranged to be separated from the grounding metal 121. The antenna unit 140 is coupled with the charging interface 130. It can be understood that the antenna unit 140 is arranged close to the charging interface 130, that is, the antenna unit 140 is arranged close to the charging interface 130 relative to the second frame 112, such that the antenna unit 140 and the charging interface 130 form a coupling relationship.

Exemplarily, the first frame 111 is a bottom frame of the electronic device, and the second frame 112 is a top frame of the electronic device. The terms "bottom" and "top" are based on a direction of the electronic device when a user uses it. In this case, the charging interface 130 is disposed at the bottom of the electronic device, and the antenna unit 140 is disposed at the bottom of the electronic device. Exemplarily, when the housing 110 is made of metal material, the antenna unit 140 includes a first portion 141 formed by at least a part of the housing 110. For example, the first portion 141 is formed by at least a part of the first frame 111. In this way, it is more conducive to reducing the space occupied by the antenna unit 140 and achieving the full screen of the electronic device. The antenna unit 140 may also include a second portion 142 disposed close to the charging interface 130, and at least a part of the second portion 142 may be parallel to the first frame 111.

Based on the above, the grounding solder pad 132 of the metal casing 131 of the charging interface 130 is arranged to be separated from the grounding metal 121 of the circuit board 120, compared with a solution of connecting the grounding solder pad 132 of the metal casing 131 and the grounding metal 121, the metal casing 131 is not grounded and does not occupy the clearance area of the antenna unit 140, which is equal to increasing the clearance area of the antenna unit 140 occupied by the charging interface 130 in the related art. Further, the charging interface 130 is also coupled with the antenna unit 140, such that the metal casing 131 of the charging interface 130 may serve as the antenna radiator of the antenna unit 140, which is conducive to improving the antenna performance of the antenna unit 140.

In some embodiments, continuing to refer to FIG. 2, the circuit board 120 includes a blank area 122 adjacent to the grounding metal 121, and the charging interface 130 is fixed to the blank area 122. Exemplarily, the blank area 122 may be formed by cutting a hole in the circuit board 120. Exemplarily, the blank area 122 may be formed by a non-metallic material. For example, the blank area 122 includes a non-metallic substrate fixedly connected with the grounding solder pad 132. The non-metallic substrate may be a board substrate of the circuit board 120 after the metal material is removed. Exemplarily, the material of the non-metallic substrate may be PBT (polybutylene terephthalate). The charging interface 130 is supported by the non-metallic substrate, and the non-metallic substrate is fixedly connected with the grounding solder pad 132 to stably fix the charging interface 130.

In some embodiments, continuing to refer to FIG. 2, there is a gap between the grounding solder pad 132 and the grounding metal 121 in a direction of the board surface of the circuit board 120. As such, the separation between the grounding solder pad 132 and the grounding metal 121 may be ensured, such that the metal casing 131 of the charging interface 130 does not occupy the clearance area of the antenna unit 140, which is conducive to improving the radiation efficiency of the antenna unit 140.

Figure 3:
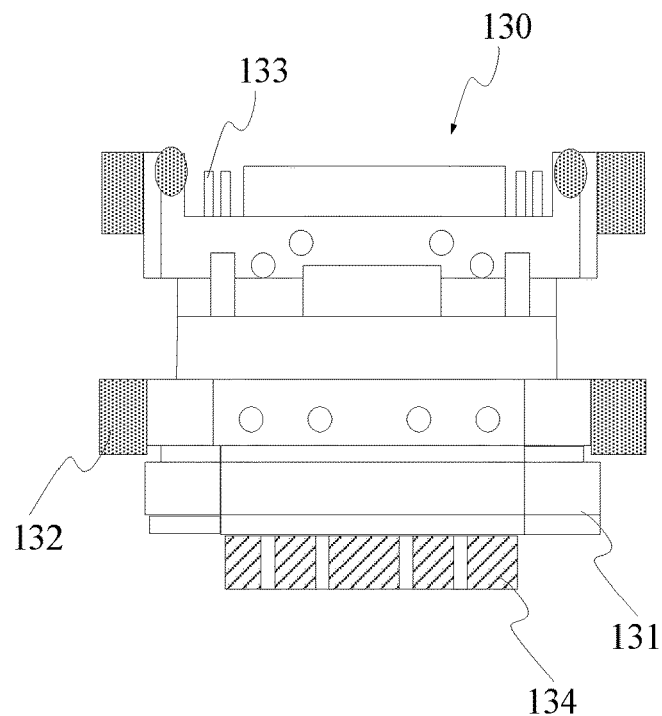
FIG. 3 illustrates a schematic view of a charging interface according to an exemplary embodiment of the present disclosure.
Figure 4:
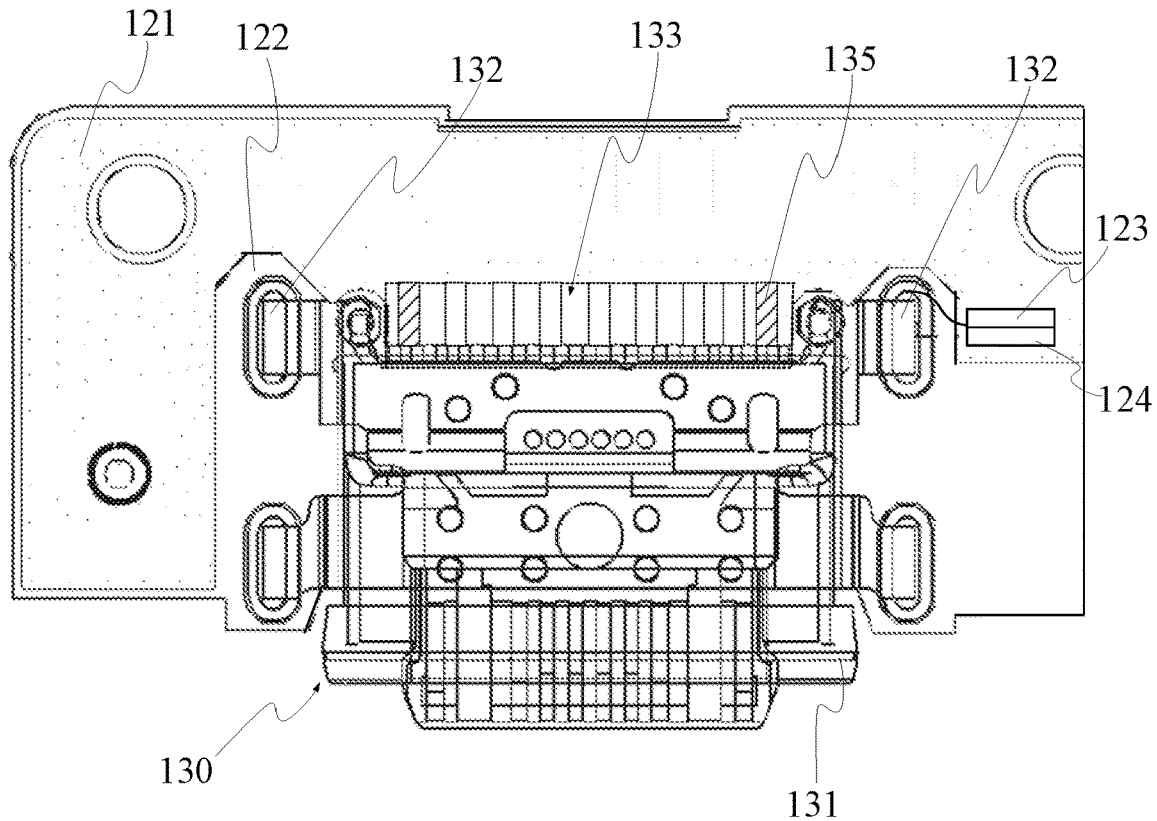
FIG. 4 illustrates a schematic view of a relative position between a charging interface and a circuit board according to an exemplary embodiment of the present disclosure.

FIG. 3 illustrates a schematic view of a charging interface 130 according to an exemplary embodiment of the present disclosure, and FIG. 4 illustrates a schematic view of a relative position between the charging interface 130 and the circuit board 120 according to an exemplary embodiment of the present disclosure. In some embodiments, referring to FIGS. 3 and 4, the charging interface 130 also includes a plurality of pins 133 and an insulating member 134 carrying the plurality of pins 133, the metal casing 131 is fitted over the insulating member 134, the metal casing 131 is separated from the plurality of pins 133 by the insulating member 134, and the plurality of pins 133 includes a grounding pin 135 electrically connected with the circuit board 120. The plurality of pins 133 are separated from the metal casing 131 by the insulating member 134, and connected with the circuit board 120 by the grounding pin 135, such that the metal casing 131 does not affect the transmission operation of the plurality of pins 133.

Exemplarily, the charging interface 130 includes a mini USB interface, a micro USB interface, a Dock interface, a Lightning interface or a Type-C interface. Exemplarily, the insulating member 134 is a plastic member, and the plastic member wraps the middle parts of the plurality of pins 133.

Figure 5:
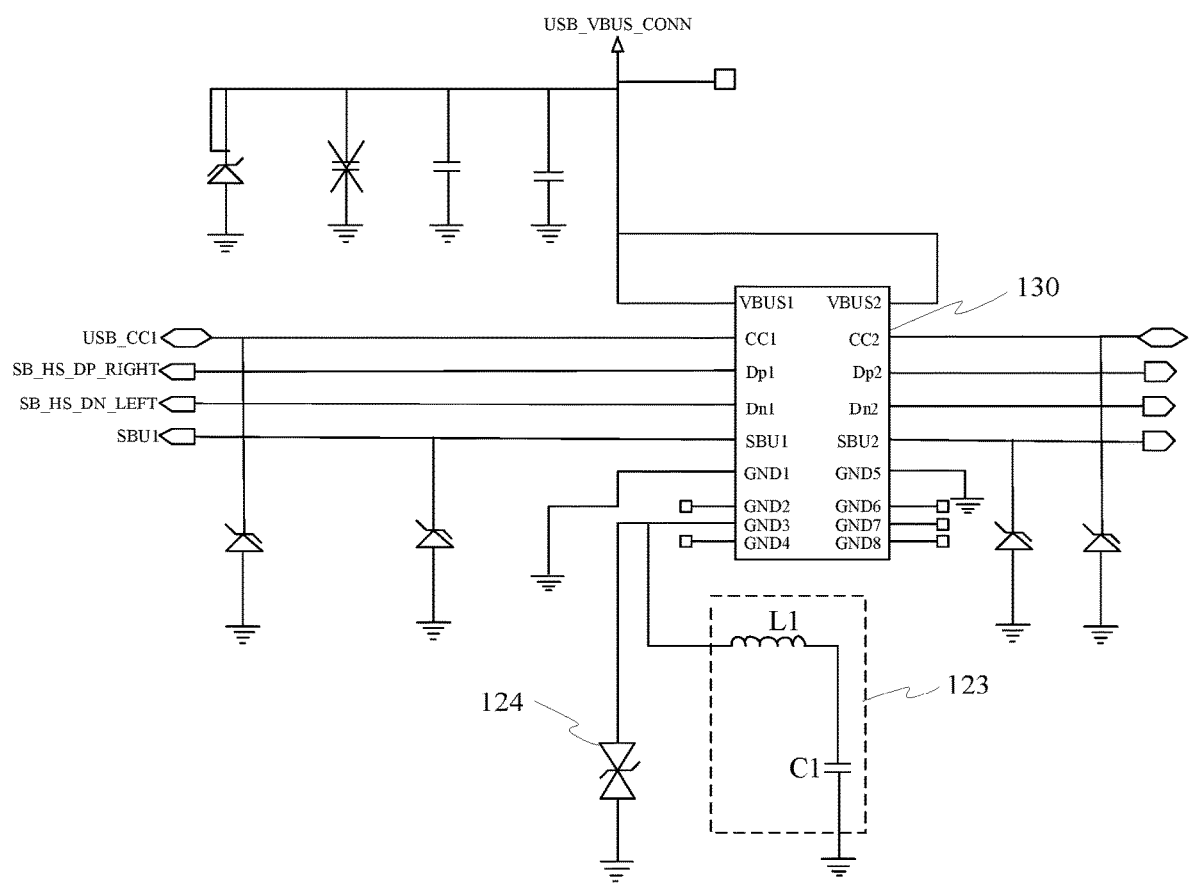
FIG. 5 illustrates a partial circuit diagram of an electronic device according to an exemplary embodiment of the present disclosure.

FIG. 5 illustrates a partial circuit diagram of an electronic device according to an exemplary embodiment of the present disclosure. Referring to FIG. 5, the plurality of pins 133 include: pin VBUS1, pin VBUS2, pin CC1, pin CC2, pin Dp1, pin Dp2, pin Dn1, pin Dn2, pin SBU1, pin SBU2, pin GND1 and pin GND5. Pin GND1 and pin GND5 are grounding pins 135. Pin VBUS1 and pin VBUS2 are connected with a power supply end USB_VBUS_CONN, a capacitor and a transient diode are connected in parallel between the power supply end USB_VBUS_CONN and pin VBUS1 to function of filtering.

Figure 6:
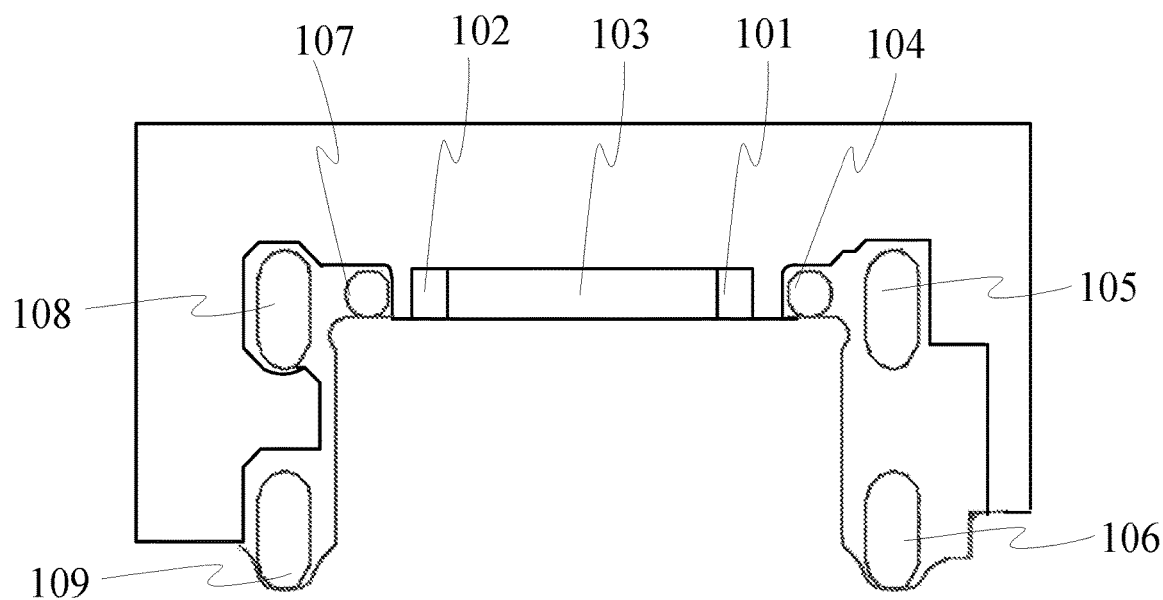
FIG. 6 illustrates a schematic view of a distribution of a circuit board according to an exemplary embodiment of the present disclosure.

FIG. 6 illustrates a schematic view of a distribution of a circuit board 120 according to an exemplary embodiment of the present disclosure. Referring to FIG. 6, pin GND1 is connected to a first position 101 in FIG. 6, pin GND5 is connected to a second position 102 in FIG. 6, and other pins 133 are connected to a third position 103 in FIG. 6.

Continuing to refer to FIGS. 5 and 6, the metal casing 131 includes six grounding solder pads 132, namely grounding solder pad GND2, grounding solder pad GND3, grounding solder pad GND4, grounding solder pad GND6, grounding solder pad GND7 and grounding solder pad GND8, respectively. Each of the grounding solder pad GND2, grounding solder pad GND3, grounding solder pad GND4, grounding solder pad GND6, grounding solder pad GND7 and grounding solder pad GND8 is not connected to the grounding metal 121. The grounding solder pad GND2 is connected to a fourth position 104 in FIG. 6, the grounding solder pad GND3 is connected to a fifth position 105 in FIG. 6, the grounding solder pad GND4 is connected to a sixth position 106 in FIG. 6, the grounding solder pad GND6 is connected to a seventh position 107 in FIG. 6, the grounding solder pad GND7 is connected to an eighth position 108 in FIG. 6, and the grounding solder pad GND8 is connected to a ninth position 109 in FIG. 6. The fourth position 104, the fifth position 105, the sixth position 106, the seventh position 107, the eighth position 108 and the ninth position 109 are all non-metallic materials, and the first position 101, the second position 102 and the third position 103 are all metallic materials.

As mentioned above, since the metal casing 131 of the charging interface 130 may directly serve as the antenna radiator coupled with the antenna unit 140, when the charging interface 130 transmits data or current, noise wave will inevitably appear and affect the radiation performance of the antenna unit 140. In order to solve this problem, in some embodiments, referring to FIGS. 4 and 5, the circuit board 120 also includes: a filter unit 123, a first end of the filter unit 123 is connected with one grounding solder pad 132, and a second end is grounded. Exemplarily, in FIG. 5, the filter unit 123 is connected to the grounding solder pad GND3. The noise wave generated by the charging interface 130 is filtered by the filtering unit 123 to avoid affecting the operation of the antenna unit 140, so as to improve the antenna performance of the antenna unit 140. Exemplarily, the filter unit 123 includes an inductor L1 and a capacitor C1, a first end of the inductor L1 is connected to the grounding solder pad 132, a second end is connected to the capacitor C1, and the capacitor C1 is grounded. In this way, a LC filter circuit is formed by the combination of the inductor L1 and the capacitor C1, and the filter function is achieved by the combination of the inductor L1 and the capacitor C1, so as to prevent the noise wave from interfering with the antenna performance of the antenna unit 140.

Since the metal casing 131 is not grounded, it is easy to generate electrostatic interference and then affect the antenna performance of the antenna unit 140. In some embodiments, referring to FIGS. 4 and 5, the circuit board 120 also includes: an antistatic unit 124, a first end of the antistatic unit 124 is connected between the filter unit 123 and the grounding solder pad 132, and a second end is grounded. The antistatic unit 124 may play an antistatic role to prevent static electricity from interfering with the antenna performance of the antenna unit 140. In addition, the antistatic unit 124 and the filter unit 123 are connected to one grounding solder pad 132 to ensure that all grounding solder pads 132 are not grounded. It should be noted that in the embodiments of the present disclosure, due to a relatively large impedance of the filter unit 123 and the antistatic unit 124, the filter unit 123 and the antistatic unit 124 may be considered in an open circuit state when the high frequency signal is received, and thus, the grounding solder pad 132 connected with the filter unit 123 and the antistatic unit 124 is considered to be not grounded.

Exemplarily, the antistatic unit 124 includes a bidirectional transient diode. The bidirectional transient diode may absorb an instantaneous high-power pulse in both positive and negative directions, and suppress a voltage to a preset level, such that the charging interface 130 may pass a maximum allowable pulse, so as to effectively protect the charging interface 130 and avoid the static electricity generated by it from interfering with the antenna performance of the antenna unit 140.

In some embodiments, referring to FIGS. 2 and 4, the grounding solder pad 132 is provided at a corner of the metal casing 131 away from the external interface 113, and one grounding solder pad 132 away from the external interface 113 and located at the corner of the metal casing 131 is connected with the filter unit 123. Exemplarily, the grounding solder pad 132 away from the external interface 113 and located at the corner of the metal casing 131 is the grounding solder pad GND3, which is connected with the filtering unit 123 and the antistatic unit 124. In this way, it is convenient to arrange the filter unit 123 and the antistatic unit 124 on the circuit board 120.

Figure 7:
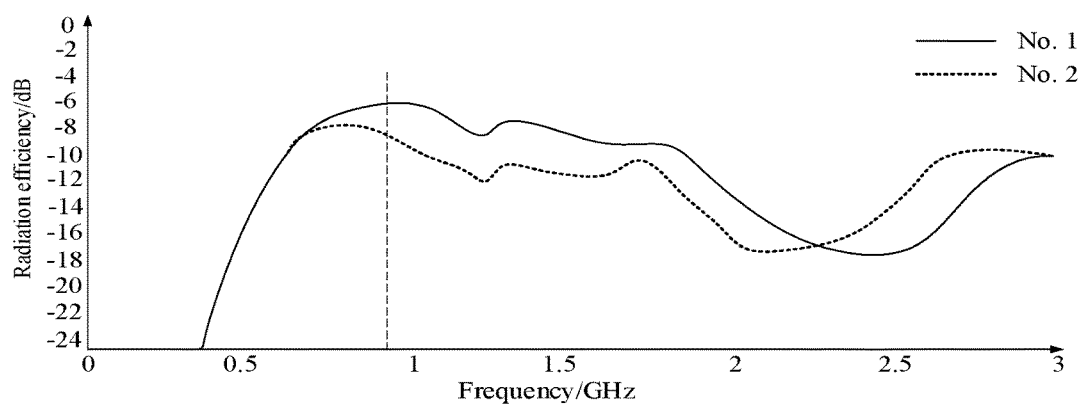
FIG. 7 is a curve graph showing a relationship between a frequency and a radiation efficiency of an antenna unit according to an exemplary embodiment of the present disclosure.

FIG. 7 is a curve graph showing a relationship between frequency and radiation efficiency of an antenna unit 140 according to an exemplary embodiment of the present disclosure. Curve No. 1 represents: a corresponding relationship curve when the grounding solder pad 132 of the metal casing 131 is separated from the grounding metal 121 of the circuit board 120, and one grounding solder pad 132 is connected with the antistatic unit 124 and the filtering unit 123. Curve No. 2 represents: a corresponding relationship curve when the grounding solder pad of metal casing and the grounding metal of circuit board are connected in the related art. It can be seen from FIG. 7 that, the radiation efficiency of the antenna unit 140 of the electronic device provided in the present disclosure is higher than that of the antenna unit of the electronic device in the related art within a frequency range of about 0.7 GHz to 2.3 GHz. It can thus be known that, the antenna performance of the electronic device provided by the embodiments of the present disclosure in a low frequency band is better than the antenna performance of the electronic device provided in the related art.

To sum up, in the electronic device provided by the embodiments of the present disclosure, the grounding solder pad 132 of the metal casing 131 of the charging interface 130 is arranged to be separated from the grounding metal 121 of the circuit board 120, compared with a solution of connecting the grounding solder pad 132 of the metal casing 131 and the grounding metal 121, the metal casing 131 is not grounded and does not occupy the clearance area of the antenna unit 140, which is equal to increasing the clearance area occupied by the charging interface 130 in the related art, and further the metal casing 131 of the charging interface 130 is coupled with the antenna unit 140 to act as the antenna radiator, so as to be conducive to improving the antenna performance of the antenna unit 140. By connecting one grounding solder pad 132 with the filtering unit 123 and the antistatic unit 124, the filtering unit 123 filters out the interferential noise wave, and the antistatic unit 124 eliminates the static electricity, so as to ensure the antenna performance of the antenna unit 140.

The above embodiments of the present disclosure may be complementary for each other under the case of no conflict.

The above description concerns only preferable embodiments of the present disclosure, which is not construed to limit the present disclosure. Any modification, equivalent replacement, improvement made within the spirit and principle of the present disclosure should be included in the protection scope of the present disclosure.

What is claimed is:

1. An electronic device comprising:
    a housing provided with an external interface;
    a circuit board arranged in the housing and comprising a grounding metal; a charging interface arranged in the housing and in communication with the external interface, the charging interface comprising a metal casing, the metal casing being provided with a plurality of grounding solder pads, the grounding solder pads being arranged to be geographically separated from the grounding metal; and an antenna unit being coupled with the charging interface, wherein the metal casing is not grounded, wherein the circuit board further comprises a filter unit, a first end of the filter unit is connected with one grounding solder pad, and a second end of the filter unit is grounded; and wherein the one grounding solder pad is provided at a corner of the metal casing away from the external interface, and the one grounding solder pad away from the external interface and located at the corner of the metal casing is connected with the filter unit.

2. The electronic device according to claim 1, wherein the circuit board comprises a blank area adjacent to the grounding metal, and the charging interface is fixed to the blank area.

3. The electronic device according to claim 1, wherein the filter unit comprises an inductor and a capacitor, a first end of the inductor is connected to the grounding solder pad, a second end of the inductor is connected to the capacitor, and the capacitor is grounded.

4. The electronic device according to claim 1, wherein the circuit board further comprises an antistatic unit, a first end of the antistatic unit is connected between the filter unit and the grounding solder pad, and a second end of the antistatic unit is grounded.

5. The electronic device according to claim 1, wherein the charging interface further comprises a plurality of pins and an insulating member carrying the plurality of pins, the metal casing is fitted over the insulating member, the metal casing is separated from the plurality of pins by the insulating member, and the plurality of pins comprises a grounding pin electrically connected with the circuit board; and/or
    the antenna unit comprises a first portion formed by at least a part of the housing.

6. The electronic device according to claim 1, wherein the housing comprises a first frame and a second frame opposite to the first frame, and the external interface is arranged on the first frame.

7. The electronic device according to claim 1, wherein the circuit board comprises a radio frequency circuit board connected with the antenna unit to control operation of the antenna unit.

8. The electronic device according to claim 1, wherein the metal casing comprises six grounding solder pads connected to six different positions of the circuit board, and the six positions are all non-metallic materials.

9. The electronic device according to claim 2, wherein there is a gap between the grounding solder pad and the grounding metal in a direction of a board surface of the circuit board.

10. The electronic device according to claim 2, wherein the blank area comprises a non-metallic substrate, and the non-metallic substrate is fixedly connected with the grounding solder pad.

11. The electronic device according to claim 2, wherein the blank area is formed by cutting a hole in the circuit board.

12. The electronic device according to claim 4, wherein the antistatic unit comprises a bidirectional transient diode.

13. The electronic device according to claim 5, wherein the insulating member is a plastic member, and the plastic member wraps middle parts of the plurality of pins.

14. The electronic device according to claim 6, wherein the antenna unit is arranged close to the charging interface relative to the second frame.

15. The electronic device according to claim 6, wherein the antenna unit comprises a first portion formed by at least a part of the first frame.

16. The electronic device according to claim 6, wherein the antenna unit further comprises a second portion disposed close to the charging interface, and at least a part of the second portion is parallel to the first frame.

17. An electronic device comprising:
    a housing provided with an external interface;
    a circuit board arranged in the housing and comprising a grounding metal;
    a charging interface arranged in the housing and in communication with the external interface, the charging interface comprising a metal casing, the metal casing being provided with a plurality of grounding solder pads, the grounding solder pads and the grounding metal defining a gap therebetween; and an antenna unit being coupled with the charging interface, wherein the metal casing is not grounded, wherein the circuit board further comprises a filter unit, a first end of the filter unit is connected with one grounding solder pad, and a second end of the filter unit is grounded; and wherein the one grounding solder pad is provided at a corner of the metal casing away from the external interface, and the one grounding solder pad away from the external interface and located at the corner of the metal casing is connected with the filter unit.

18. An electronic device comprising:
    a housing provided with an external interface;
    a circuit board arranged in the housing and comprising a grounding metal and a blank area adjacent to the grounding metal; a charging interface arranged in the housing and in communication with the external interface, the charging interface comprising a metal casing, the charging interface being formed on the blank area; and an antenna unit being coupled with the charging interface, wherein the metal casing is not grounded, wherein the circuit board further comprises a filter unit, a first end of the filter unit is connected with one grounding solder pad, and a second end of the filter unit is grounded; and wherein the one grounding solder pad is provided at a corner of the metal casing away from the external interface, and the one grounding solder pad away from the external interface and located at the corner of the metal casing is connected with the filter unit.

\* \* \* \* \*